United States Patent [19]
Chan et al.

[11] Patent Number: 6,081,217
[45] Date of Patent: Jun. 27, 2000

[54] DECODER FOR 2-DIMENSIONAL INPUT DEVICES

[75] Inventors: I-Sheng Chan; Yun-Yuao Wang, both of Taipei, Taiwan

[73] Assignee: Tenx Technology, Inc., Taipei, Taiwan

[21] Appl. No.: 09/114,049

[22] Filed: Jul. 13, 1998

[51] Int. Cl.[7] .................................................. H03M 1/66
[52] U.S. Cl. ............................................ 341/144; 341/154
[58] Field of Search ................................... 341/144, 153, 341/154, 133, 136, 20

[56] References Cited

U.S. PATENT DOCUMENTS 5,453,743  9/1995  Kang ........................................ 341/144
5,949,362  9/1999  Tesch et al. ............................. 341/144

*Primary Examiner*—Brian Young
*Attorney, Agent, or Firm*—Bacon & Thomas, PLLC

[57] ABSTRACT

A simplified decoder for a decoder for 2-dimensional input devices with less number of pads is disclosed. Two pads are used to represent the addresses in one dimension of the input means in the 2-dimensional input device. Two capacitors are charged through a number of resistors, which number is decided by the number of addresses of said dimension. The time difference in charging the capacitors is measured to determine the address of an actuated input means in said dimension.

3 Claims, 2 Drawing Sheets

DECODER FOR 2-DIMENSIONAL INPUT DEVICES

FIELD OF THE INVENTION

The present invention relates to a decoder for 2-dimensional input devices, especially to a decoder for keyboards or keyboards for the computer system.

BACKGROUND OF THE INVENTION

A decoder for 2-dimensional input devices, such as keyboards or keyboards for the computer system, is always prepared as an integrated circuit (IC) chip. In the computer industry, most commonly used decoder IC's are 40-pad standard decoders. Among the 40 pads, 14 pads (I0–I13) are designated to represent the respective horizontal lines of input keys of a keyboard and 12 pads (P0–P11) are to represent the respective vertical columns of same.

A 2-dimensional input device has a number of input keys arranged in a planar coordinate. Keys belonging to a same horizontal address are electrically connected serially with a horizontal line. Keys belonging to a same vertical address are electrically connected serially with a vertical line. In other words, each key is connected with a horizontal line and a vertical line. These horizontal lines and vertical lines are then connected with their respective corresponding pads (such as I0–I13, P0–P11) of the decoder. When an input key is pressed, variations of voltage will occur in its corresponding horizontal line and vertical line, respectively. This voltage variation, in turn, may be deemed a "1" signal generated by the lines. The signals so generated may be scanned and the coordinate of the pressed input key may be decoded.

The decoder as described above is widely used in keyboards for computer systems personal digital assistants (PDA), telephones, calculators etc. Due to the relatively great number of input keys of the 2-dimensional input device, 40-pad decoder IC's have become a standard decoder for the input devices of these equipments. The cost of such 40-pad decoder IC's has thus become a great burden in the manufacture of these equipments.

It is thus a need in the industry to have a decoder for 2-dimensional input devices with less number of pads. It is also a need in the industry to have a simplified decoder for 2-dimensional input devices so that manufacture costs thereof may be reduced.

PURPOSES OF THE INVENTION

The purpose of this invention is to provide a decoder for 2-dimensional input devices with less number of pads.

Another purpose of this invention is to provide a simplified decoder for 2-dimensional input devices s o that manufacture costs thereof may be reduced.

SUMMARY OF THE INVENTION

According to this invention, a simplified decoder for a decoder for 2-dimensional input devices with less number of pads is provided. Two pads are used to represent the addresses in one dimension of the input means in the 2-dimensional input device. Two capacitors are charged through a number of resistors, which number is decided by the number of addresses of said dimension. The time difference in charging the capacitors is measured to determine the address of an actuated input means in said dimension These and other purposes and advantages of this invention may be clearly understood from the detailed description by referring to the following drawings.

IN THE DRAWINGS

DETAILED DESCRIPTION OF THE INVENTION

The following is a detailed description of the embodiment of the decoder for 2-dimensional input devices of this invention.

Figure 1:
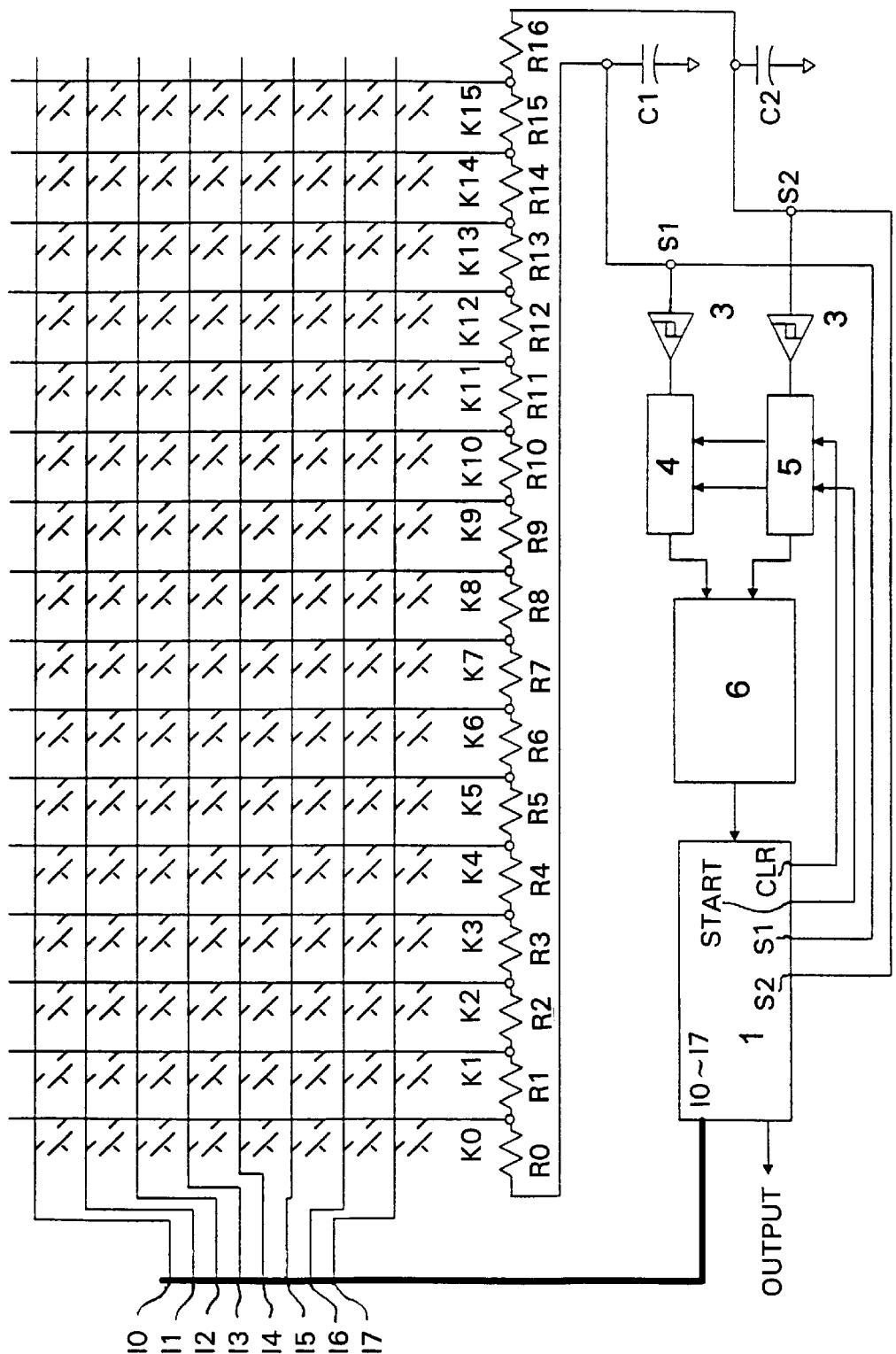
FIG. 1 illustrates the system diagram of an embodiment of the decoder for 2-dimensional input devices of this invention.

FIG. 1 illustrates the system diagram of an embodiment of the decoder for 2-dimensional input devices of this invention. As shown in the figure, a decoder for 2-dimensional input devices may be accomplished in a microprocessor 1. The microprocessor 1 has a less number of pads, compared with the conventional 40-pad standard decoder. Among the pads, 8(I0–I7) are connected to the horizontal lines (I0–I7) of an input device 2, respectively, and 2 (S1 and S2) are connected to both ends of a line (S) representing the vertical lines (K0–K15). Line (S) is connected in serial with 17 resistors (R0–R16). The resistance of these 17 resistors are of the same value so that R0=R1= . . . =R15=R16. Between each two resistors are 16 vertical line contacts (P0–P15) which are connected with the 16 vertical lines of the input device respectively. Pads S1 and S2 are further connected with capacitors C1 and C2 respectively. A Schmidt trigger 3 is connected with pads S1 and S2 and timers 4 and 5. The inputs of the first timer 4 and the second timer 5 are connected to a time difference sensor 6.

In the embodiment of this invention, the input device 2 has 8 horizontal lines of input keys and 17 vertical columns of input keys. This invention, however, is not limited to such input device. Although it is not intended to limit the scope of this invention, the spirit of this invention rests in that only 2 pads are used to represent addresses of input keys in the dimension with greater number of lines. For example, if the number of the horizontal lines is greater than that of the vertical columns, such as in a 14*12 keyboard as described above, pads S1 and S2 are used to represent the addresses of input keys in the vertical dimension. In such a case, 12 pads are used to represent the addresses of input keys in the horizontal dimension.

Microprocessor 1 is the control center of the system. Scanning signals at a certain frequency, such as 3.58 MHz, are generated by the microprocessor 1. One an input key is pressed, the time difference of R-C charging may be sensed and the address of the input key may be determined.

The operation of the decoder of this invention will be described in the followings. As a great difference in the capacitance of capacitors C1 and C2 may exist due to the quality control in the mass production of capacitors, it is necessary to calibrate the system before it starts to operate. At first, microprocessor 1 resets the signals in pads S1 and S2 so that levels of pads S1 and S2 are both "0". It then generates a "1" signal to pad S2 and starts the operation of the first timer 4 to measure time necessary for capacitor C1 to be charged to the level of "1". Suppose time needed to charge capacitor C1 is TC1, since R0=R1= . . . =R15=R16, we have:

$$T_{C1} = 2.2 \times C \times (R_0 + R_1 + \ldots + R_{15} + R_{16}) = 2.2 \times C_1 \times 17 R_n$$

In this equation, 2.2 is a factor, n=0, 1, . . . , 16.

As such, the contribution of each resistor Rn to the charging of capacitor C1 is:

$$\frac{T_{C_1}}{17} = 2.2 \times C_1 \times R_n = \Delta T_{S_1}$$

Similarly, the signals of pads S1 and S2 are again reset to "0". A "1" signal is output to capacitor S1 and the second timer 5 starts to measure time needed for capacitor C2 to be charged to "1", TC2, as follows:

$$\frac{T_{C_2}}{17} = 2.2 \times C_2 \times R_n = \Delta T_{S_2}$$

After both ΔTS1 and are obtained, microprocessor 1 may use these values to calibrate the scanning operation which will be described hereinafter.

Figure 2:
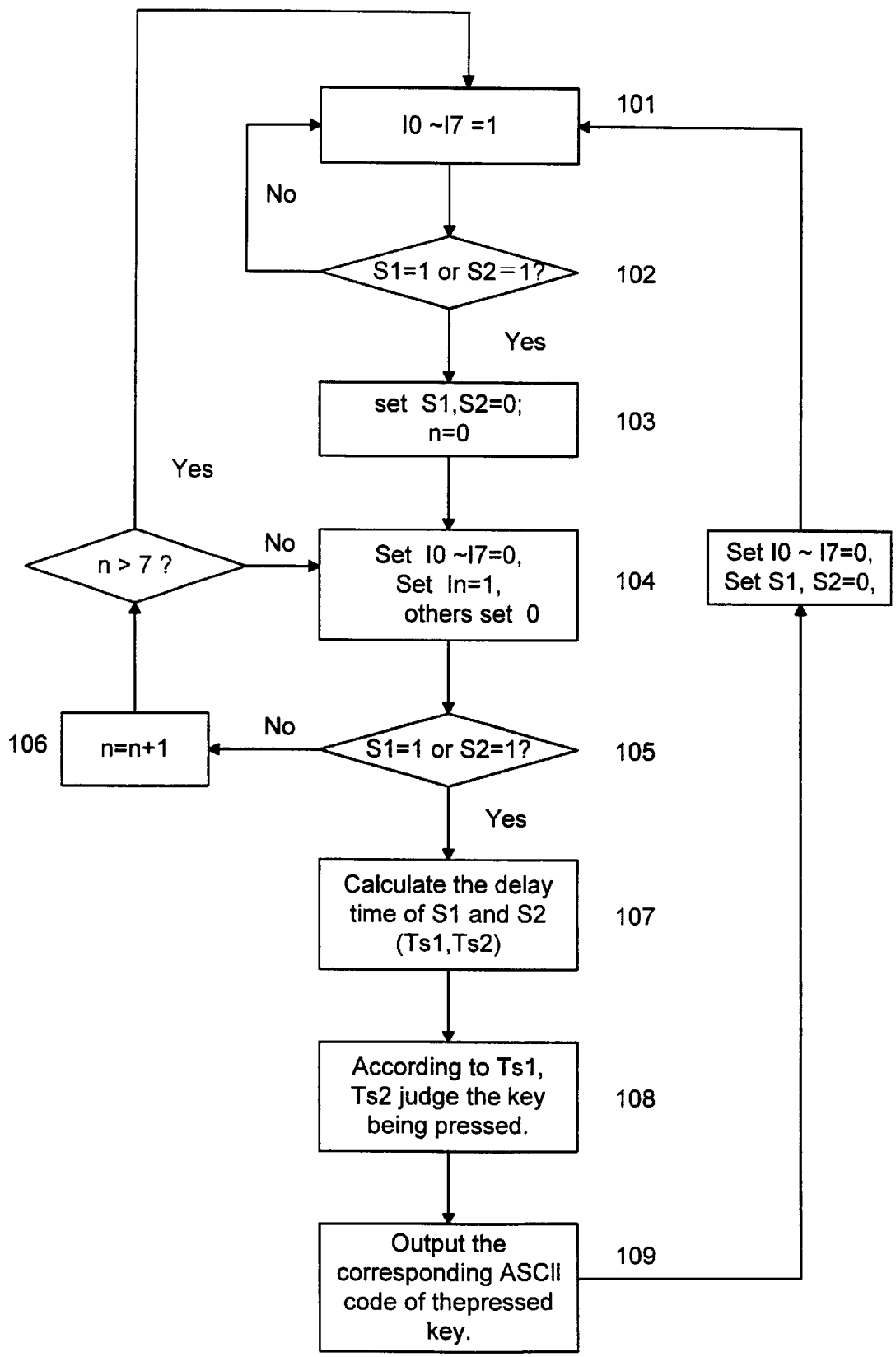
FIG. 2 illustrates the flow chart of the decoding processes for an embodiment of the decoder for 2-dimensional input devices of this invention.

FIG. 2 illustrates the flow chart of the decoding processes for an embodiment of the decoder for 2-dimensional input devices of this invention. As shown in this figure, during the scanning operation of the microprocessor 1, at 101, when no input key is pressed, microprocessor 1 outputs "1" signals to all the pads I0–I7. Whenever an input key N is pressed, at 102 a signal is sensed at pads S1 and S2. At 103 microprocessor 1 outputs "0" signals to all the pads I0–I7 simultaneously and makes the levels of pads S1 and S2 to be "0".

Later, at 104 microprocessor 1 generates "1" signals and outputs to pads I0–I7 in sequence. At 105 timers 4 and 5 starts to measure time needed for pads S1 and S2 to generate "1" signals, respectively.

If at the horizontal line being scanned, no input key is being pressed, no "1" signal will be generated at pads S1 and S2. After a predetermined period of time (for example, Tmax=38RC), microprocessor 1 makes the level of the pad In being scanned into "0" and turn to the next line In+1 at 106. At this time, a "1" signal will be generated by In+1.

On the other hand, if an input key is being pressed, a "1" signal will be generated at its corresponding K line (among lines K0–K15). Let this K line to be Kn. The signal generated by line Kn will charge capacitors C1 and C2 through resistors R0–R16. The numbers of resistors between Kn and C1 and between Kn and C2 will influence the time needed to charge capacitors C1 and C2, respectively. Thus, time needed for pads S1 and S2 to generate "1" signals (TS1 and TS2 respectively) will have a relation with such numbers of resistors. At 107 timers 4 and 5 measure TS1 and TS2 respectively. At 108 time difference sensor 6 calculates the difference between TS1 and TS2 and outputs the difference Δt to microprocessor 1. Microprocessor 1 then, at 109, used the time difference Δt to decide the number (address) of the vertical line Km (m=0, 1, . . . , 15) in which an input key N is being pressed. This number or address represents the vertical address of the key being pressed. At 110, microprocessor 1 determines the coordinate of the pressed input key (n, m) based on the numbers of In and Km and outputs the coordinate to the serial port of the equipment (not shown). Such coordinate is usually an ASCII code.

After the above-said operation, the levels of pads I0–I7 and S1 and S2 are made "0" by microprocessor 1 and scanning operations are conducted until the power supplied to the input device is shut off.

In determining the address of the vertical lines, any conventional method may be adopted. In the embodiment of this invention, the following calculation is used.

Suppose R1=R2= . . . =R15=R16=R. If level of Km=1, the signal of Km will charge capacitors C1 and C2.

Time needed for capacitor C1 to be charged TS1:

$$T_{S1} = 2.2 \times C \times (R_0 + R_1 + \ldots + R_m) = 2.2 \times C_1 \times m \times R$$

Time needed for capacitor C2 to be charged TS2:

$$T_{S2} = 2.2 \times C_2 \times (R_{m+1} + R_{m+2} + \ldots + R_{16}) = 2.2 \times C_2 \times (16-m) \times R$$

In the operation of the microprocessor 1, suppose time needed to charge capacitors C1 and C2 through an independent resistor R are ΔTS1 and ΔTS2 respectively and:

$$\Delta T_{S1} = 2.2 \times R \times C_1$$

$$\Delta T_{S2} = 2.2 \times R \times C_2$$

We then have:

$$\frac{T_{S_2}}{\Delta T_{S_2}} = \frac{2.2 \times C_2 \times (16-m) \times R}{2.2 \times R \times C_2} = 16 - m$$

$$\frac{T_{S_1}}{\Delta T_{S_1}} = \frac{2.2 \times C_1 \times m \times R}{2.2 \times R \times C_1} = m$$

The address of Km may be easily obtained from the above equations.

EFFECTS OF THE INVENTION

As described above, in the decoder for 2-dimensional input devices of this invention only 2 pads are used to represent greater number of lines for input keys. As shown in the embodiment of this invention, only 10 pads are used to connect with the horizontal and vertical lines of the input device, while in the conventional art, 24 (8+16) pads will be required. The capacitors and resistors as used in this invention are low-cost components. Timers and the time difference sensor are standard components of a microprocessor. Although two pads are used to connect S1 and S2 pads with the timers and time difference sensor S0, total number of pads needed in this decoder is approximately 20, while in the conventional art, 40 pads are always necessary. It is obviously shown that the decoder of this invention has a simplified design and, thus, costs for manufacture of the decoder may be reduced.

Although in the description of the embodiment of this invention, a keyboard is taken for example, the decoder of this invention may be used in any 2-dimensional input device.

The self-calibration as disclosed in this invention is helpful to solve the problem of quality control of the components, such as capacitors, so that components with acceptable quality may be used in the decoder of this invention.

In another embodiment of this invention, both vertical and horizontal lines are decoded with the method applied to decode the address of the vertical dimension of the input keys. Similar effects may be obtained with necessary adjustments thereto.

As the present invention has been shown and described with reference to the preferred embodiments thereof, those skilled in the art will recognize that the above and other changes may be made therein without departing from the spirit and scope of the invention.

What is claimed is:

1. A decoder for 2-dimensional input devices comprising input means arranged in a 2-dimensional layout to sense input signals generated by said input means and to determine the 2-dimensional address of an input means that generates input signals, comprising:

- a decoder to decode an external signal and to output said decoded signal, wherein said decoder comprises a group of first dimensional input pads and two second dimensional input-output pads;
- a group of first dimensional signal generating lines wherein one end of each line is connected to a pad of said first dimensional input pads respectively, and the other end may be connected to a line connected in series with a number of input means of said 2-dimensional input device, arranged at a first dimension;
- a second dimensional signal generating line, connected with said two second dimensional input-output pads wherein n+1 resistors (R0–Rn, R1=R2= . . . =Rn=R, n is a natural number) are connected in series in said second dimensional signal generating line between said two second dimensional input pads and wherein a contact to be connected with a line connected in series with a number of input means of said 2-dimensional input device, arranged in a second dimension, is positioned between each two resistors;
- two capacitors (C1 and C2) connected to said two second dimensional signal input-output pads respectively; and
- a time difference sensor connected with both said second dimensional signal input-output pads to measure the difference of time needed to charge said capacitors to a predetermined level and to output said time difference to said decoder;
- characterized in that said decoder charges said two capacitors when a signal is generated in any of said second dimensional signal generating lines and determines the number of said second dimensional signal generating line (m) according to the following equation:

$$\frac{T_{S_1}}{\Delta T_{S_1}} = \frac{2.2 \times C_1 \times m \times R}{2.2 \times R \times C_1} = m$$

and $$\frac{T_{S_2}}{\Delta T_{S_2}} = \frac{2.2 \times C_2 \times (16-m) \times R}{2.2 \times R \times C_2} = 16 - m$$

wherein TS1 represents time needed to charge capacitor C1, TS2 represents time neede to charge capacitor C2, ΔTS1 represents time needed to charge capacitor C1 through any one of said resistors and ΔTS2 represents time needed to charge capacitor C2 through any one of said resistors:

$$T_{S1}=2.2 \times C_1 \times m \times R$$

$$T_{S2}=2.2 \times C_2 \times (n+1-m) \times R$$

$$\Delta T_{S1}=2.2 \times R \times C_1$$

and $$\Delta T_{S2}=2.2 \times R \times C_2.$$

2. The decoder according to claim 1 where said time difference sensor further comprises two Schmidt triggers and two timers, each being connected with one of said second dimensional signal generating pads respectively.

3. The decoder according to claim 1 or 2, further comprising a calibration means wherein said calibration means calibrates said capacitors C1 and C2 with time needed to charge said capacitor through any one of said resistors ΔTS1 and ΔTS2, as follows:

$$\Delta T_{S_1} = \frac{T_{C_1}}{n+1} = 2.2 \times C_1 \times R$$

$$\Delta T_{S_2} = \frac{T_{C_2}}{n+1} = 2.2 \times C_2 \times R$$

wherein C1 represents the capacitance of capacitor C1, C2 represents the capacitance of capacitor C2, 2.2 is a factor; and $$T_{C1}=2.2 \times C_1 \times n \times R$$

and $$T_{C2}=2.2 \times C_2 \times n \times R.$$

* * * * *